(12) United States Patent
Cho

(10) Patent No.: US 9,236,145 B2
(45) Date of Patent: Jan. 12, 2016

(54) SEMICONDUCTOR DEVICE

(71) Applicant: SK hynix Inc., Icheon-si, Gyeonggi-do (KR)

(72) Inventor: Yong Deok Cho, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 205 days.

(21) Appl. No.: 14/073,404

(22) Filed: Nov. 6, 2013

(65) Prior Publication Data

US 2015/0033089 A1    Jan. 29, 2015

(30) Foreign Application Priority Data

Jul. 26, 2013  (KR) ........................ 10-2013-0088737

(51) Int. Cl.
| | |
|---|---|
| G11C 29/00 | (2006.01) |
| G11C 29/40 | (2006.01) |
| G11C 29/26 | (2006.01) |
| G11C 11/40 | (2006.01) |

(52) U.S. Cl.
CPC ................ *G11C 29/40* (2013.01); *G11C 29/26* (2013.01); *G11C 11/40* (2013.01); *G11C 2029/2602* (2013.01)

(58) Field of Classification Search
CPC ..... G06F 12/00; G06F 12/0607; G06F 13/00; G06F 13/28; G06F 11/1068; G06F 11/1072; G11C 29/40; G11C 11/4076
USPC .................................................. 714/718, 722
See application file for complete search history.

(56) References Cited

U.S. PATENT DOCUMENTS

| | | | | |
|---|---|---|---|---|
| 6,357,027 | B1 * | 3/2002 | Frankowsky | ................. 714/738 |
| 6,519,726 | B1 * | 2/2003 | Shibata | ......................... 714/718 |
| 6,976,195 | B1 * | 12/2005 | Seyyedy et al. | ................ 714/718 |
| RE38,956 | E * | 1/2006 | Beffa et al. | .................. 365/201 |
| 7,032,143 | B1 * | 4/2006 | Waller | ........................ 714/718 |
| 8,081,529 | B2 | 12/2011 | Pyeon | |
| 2012/0254528 | A1 | 10/2012 | Na et al. | |

* cited by examiner

*Primary Examiner* — David Ton
(74) *Attorney, Agent, or Firm* — William Park & Associates Ltd.

(57) ABSTRACT

A semiconductor device includes a compression block configured to compare and compress data of a plurality of core array blocks, by a unit of a group; a combination block configured to combine outputs of the compression block and output compression data; and a control block configured to latch the compression data and output latched data, and drive the latched data and the compression data and output resultant data to a first data line and a second data line.

20 Claims, 14 Drawing Sheets

SEMICONDUCTOR DEVICE

CROSS-REFERENCES TO RELATED APPLICATION

The present application claims priority under 35 U.S.C. §119(a) to Korean application number 10-2013-0088737, filed on Jul. 26, 2013, in the Korean Intellectual Property Office, which is incorporated herein by reference in its entirety.

BACKGROUND

1. Field of the Invention

Various embodiments relate to a semiconductor device, and more particularly, to a technology for shortening a test time of a semiconductor device.

2. Description of the Related Art

As semiconductor-related technologies are developed, the operation speed of a semiconductor memory device is gradually increasing. Among semiconductor devices, an SDRAM (synchronous dynamic random access memory) operates in synchronization with an external clock. Recently, a DDR (double data rate) type SDRAM has been used, in which data is inputted and outputted in synchronization with a clock not only at the rising edge of the clock but also at the falling edge of the clock, thereby increasing a data transmission rate. In a DDR SDRAM, DDR2 and DDR3 types have been developed and used following a DDR1 type. In the case of the DDR1 type, 2-bit prefetch is performed and the burst length (BL) of input/output data becomes 2. In the case of the DDR2, 4-bit prefetch is performed and the burst length becomes 4. In the case of the DDR3, 8-bit prefetch is performed and the burst length becomes 8. The burst length of 8 means that 8-bit data synchronized with a clock is consecutively inputted and outputted through one data input/output pad.

In the case where a memory device is applied with a read command and performs a read operation for outputting stored data, a certain time is required for the data stored in a memory cell region to be outputted to an outside of the memory device through an internal circuit. Accordingly, the read command applied from the outside should have a minimum time interval, that is, a column address strobe (CAS) to column address strobe (CAS) delay time (tCCD). For example, when a DDR3 SDRAM performs a read operation with the burst length of 8, a time interval between consecutively applied read commands should be 4tCK at the minimum.

Meanwhile, in order to improve the slope of a global input/output signal, a semiconductor memory device has a read global bus and a write global bus instead of one global bus. The write global bus transfers data from data pads to a cell array when writing data. The read global bus transfers data from a cell array to data pads when reading data.

As a semiconductor memory device is highly integrated with the development of processing technologies, in order to ensure the reliability of a chip, a test is performed through a long time using expensive test equipment after fabrication. In order for such a test of a memory device, efforts have been made to shorten and reduce a time and a cost required for performing the test, by embedding in advance a self-test circuit in a chip during a design stage.

When using test equipment for verifying the product characteristics and functions of a semiconductor chip, in order to reduce a cost, as large a number of semiconductor chips as possible should be tested through one test. Further, in order to test a large number of semiconductor chips through channels which are allocated to each equipment, entire memory chips should be tested using as small a number of input/output lines as possible.

In parallel test equipment, in order to shorten a test time, a self-test mode called a DQ (data) compression test is used. Such a data compression test as a kind of a self-test is a method in which the same data are stored in a plurality of memory cells, the stored data are simultaneously outputted, the simultaneously outputted data are compressed, and results are compared, to test the occurrence of an error in a memory.

In the case of performing the data compression test, since compressed data are outputted, the number of data output channels (that is, data pads) to be used may be minimized. Therefore, the data compression test may allow a number of dies to be simultaneously tested.

For example, a semiconductor chip undergoes various tests to be verified in the characteristics and functions of a product. In order to reduce a cost when using equipment for testing a semiconductor chip, it is necessary to test as large a number of semiconductor chips as possible through one test.

In order to test a large number of semiconductor chips, entire chips should be tested using as small a number of input/output (GIO) lines as possible. As one of such methods, a multi-bit parallel test method has been widely known in the art.

Such a multi-bit parallel test method has an advantage in that, since a pass or a fail is determined by simultaneously writing data in a plurality of cells and comparing the output values of the plurality of cells, a test time may be significantly shortened. In order to test as large a number of chips as possible by using channels allocated to each test equipment, the number of input/output lines of a semiconductor memory to be used in a test is being decreased.

If a fail occurs in one chip during a packaging stage after the multi-bit parallel test of a wafer and a product, such as an MCP (multi-chip package), a DDP (double die package) and a QDP (quad die package), which is fabricated by stacking a number of chips, is resultantly failed, losses in terms of economy and time cannot help but be substantial.

SUMMARY

A semiconductor device capable of shortening a test time in a parallel test of a semiconductor device is described herein.

In an embodiment of the invention, a semiconductor device includes: a compression block configured to compare and compress data of a plurality of core array blocks, by a unit of a group; a combination block configured to combine outputs of the compression block and output compression data; and a control block configured to latch the compression data and output latched data, and drive the latched data and the compression data and output resultant data to a first data line and a second data line.

In an embodiment of the invention, a semiconductor device includes: a compression block configured to perform a compression test for data in a probe test and output the compression data; a combination block configured to combine and output the compression data; and a control block configured to latch the compression data and output latched data, and drive the compression data and output resultant data to a first data line and a second data line.

Thanks to the above embodiment, in a parallel test of a semiconductor device, a test time may be shortened by performing a read or write operation by the unit of a half tCCD (CAS to CAS delay time).

BRIEF DESCRIPTION OF THE DRAWINGS

Features, aspects, and embodiments are described in conjunction with the attached drawings, in which.

DETAILED DESCRIPTION

Hereinafter, a semiconductor device according to the invention will be described below with reference to the accompanying drawings through various embodiments.

Figure 1:
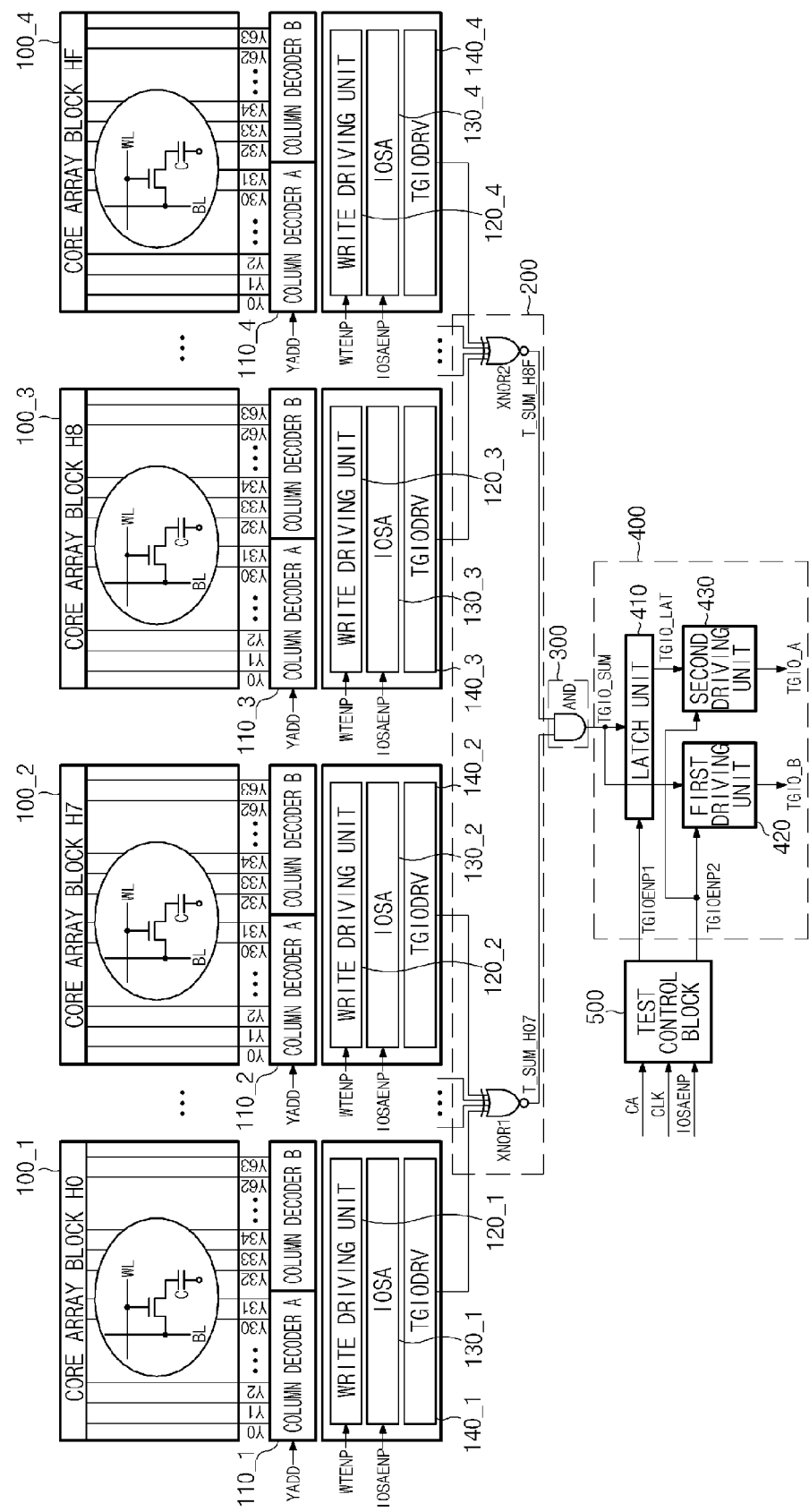
FIG. 1 is a configuration diagram of a semiconductor device in accordance with an embodiment of the present disclosure.

FIG. 1 is a configuration diagram of a semiconductor device in accordance with an embodiment of the present disclosure.

A semiconductor device in accordance with an embodiment of the present disclosure may include a plurality of core array blocks 100_1 to 100_4, a plurality of column decoders 110_1 to 110_4, a plurality of write driving units 120_1 to 120_4, a plurality of input/output sense amplifiers (IOSA) 130_1 to 130_4, a plurality of driving units (TGIODRV) 140_1 to 140_4, a compression block 200, a combination block 300, a control block 400, and a test control block 500.

In the semiconductor device in accordance with an embodiment of the present disclosure, the core array blocks 100_1 to 100_4 may operate by the units of hexa 0 to 7 and hexa 8 to F, and compare input/output data by being divided into 2 prefetch groups. That is to say, a compression test may be performed by being divided into 2 groups of the core array blocks 100_1 and 100_2 and the core array blocks 100_3 and 100_4. Therefore, in order to compress and test the data of entire banks, the burst length (BL) of 16 may be used and a write or read operation may be performed with a tCCD by the unit of 8 clocks.

The plurality of core array blocks 100_1 to 100_4 may be connected with the plurality of column decoders 110_1 to 110_4. Each of the plurality of column decoders 110_1 to 110_4 may be configured to decode a column address YADD and select a corresponding cell of the plurality of core array blocks 100_1 to 100_4. Also illustrated are a column decoder A and a column decoder B and column data Y0 to Y63 and a word line WL.

The plurality of input/output sense amplifiers 130_1 to 130_4 may be configured to sense and amplify the read data applied from the core array blocks 100_1 to 100_4 according to a sensing enable signal IOSAENP, and output resultant data to a global input/output line. The plurality of write driving units 120_1 to 120_4 may be configured to drive the write data applied from the global input/output line according to a write enable signal WTENP, and output resultant data to the plurality of core array blocks 100_1 to 100_4.

While it is described in an embodiment of the present disclosure that the plurality of input/output sense amplifiers 130_1 to 130_4 and the plurality of write driving units 120_1 to 120_4 are provided by the number of 4, respectively, it is to be noted that the numbers of input/output sense amplifiers and the write driving units may not be limited to such and may be changed sufficiently in correspondence to the size of the core array blocks 100_1 to 100_4 or other component elements.

The plurality of driving units 140_1 to 140_4 may be configured to drive the data applied from the plurality of input/output sense amplifiers 130_1 to 130_4 and output resultant data to the compression block 200. The plurality of driving units 140_1 to 140_4 may drive the data of a test global input/output line TGIO for performing a compression test and output resultant data to the compression block 200.

The compression block 200 may be connected with the plurality of driving units 140_1 to 140_4, and may be configured to compare and compress input/output data for the plurality of core array blocks 100_1 to 100_4 by a unit of a group in a probe test and then output compression data T_SUM_H07 and T_SUM_H8F to the combination block 300. The compression block 200 may compare and compress the input/output data for the plurality of core array blocks 100_1 to 100_4 by dividing them into 2 prefetch groups. The compression block 200 may include exclusive NOR gates XNOR1 and XNOR2. The exclusive NOR gate XNOR1 may perform an XNOR operation for the outputs of the driving units 140_1 and 140_2, and output the compression data T_SUM_H07. The exclusive NOR gate XNOR2 may perform an XNOR operation for the outputs of the driving units 140_3 and 140_4, and output the compression data T_SUM_H8F.

The exclusive NOR gates XNOR1 and XNOR2 may output a logic "1" when all input data have the same value. Therefore, the compression block 200 may output the compression data T_SUM_H07 and T_SUM_H8F as the logic "1" only when the data stored in the memory cells of the core array blocks 100_1 to 100_4 are the same. In the case where at least one data fail occurs, the compression block 200 may output the compression data T_SUM_H07 and T_SUM_H8F as a logic "0" and determine the data as failed data.

The combination block 300 may be configured to combine the compression data T_SUM_H07 and T_SUM_H8F of the compression block 200 and output one compression data TGIO_SUM to the control block 400. The compression data TGIO_SUM may be outputted to a pad through the control block 400. According to this fact, by coding the data read from the pad, whether the data is failed or not is discriminated.

The combination block 300 may include an AND gate AND. When both of the two compression data T_SUM_H07 and T_SUM_H8F have a logic high level, the combination block 300 may activate to a high level and output the compression data TGIO_SUM.

The control block 400 may include a latch unit 410, and driving units 420 and 430. The latch unit 410 may be configured to latch the compression data TGIO_SUM according to a first control signal TGIOENP1 and output latched data TGIO_LAT. The first driving unit 420 may be configured to drive the latched data TGIO_LAT and the compression data TGIO_SUM according to a second control signal TGIOENP2 and output resultant data to a first data line TGIO_B. The second driving unit 430 may be configured to drive the latched data TGIO_LAT according to the second control signal TGIOENP2 and output resultant data to a second data line TGIO_A. Moreover, in the first or second driving units 420 and 430, enable times of the first control signal TGIOENP1 and the second control signal TGIOENP2 may be different from each other, and the compression data TGIO_ SUM and the latched data TGIO_LAT may be simultaneously outputted when the second control signal TGIOENP2 is enabled.

The test control block 500 may be configured to generate the first and second control signals TGIOENP1 and TGIOENP2 according to column addresses CA<n:0>, a clock CLK and the sensing enable signal IOSAENP, and output the control signals TGIOENP1 and TGIOENP2 to the control block 400. Further, the first control signal TGIOENP1 and the second control signal TGIOENP2 may be controlled in their logic states by a level of the most significant column address CA. The most significant column address YADD<9> may toggle by a unit of a half tCCD (CAS to CAS delay time) shown in FIG. 4. In addition, column data of different groups may be sequentially activated by the level of the most significant column address YADD<9>, and may be transferred as compression data TGIO_SUM.

Figure 2:
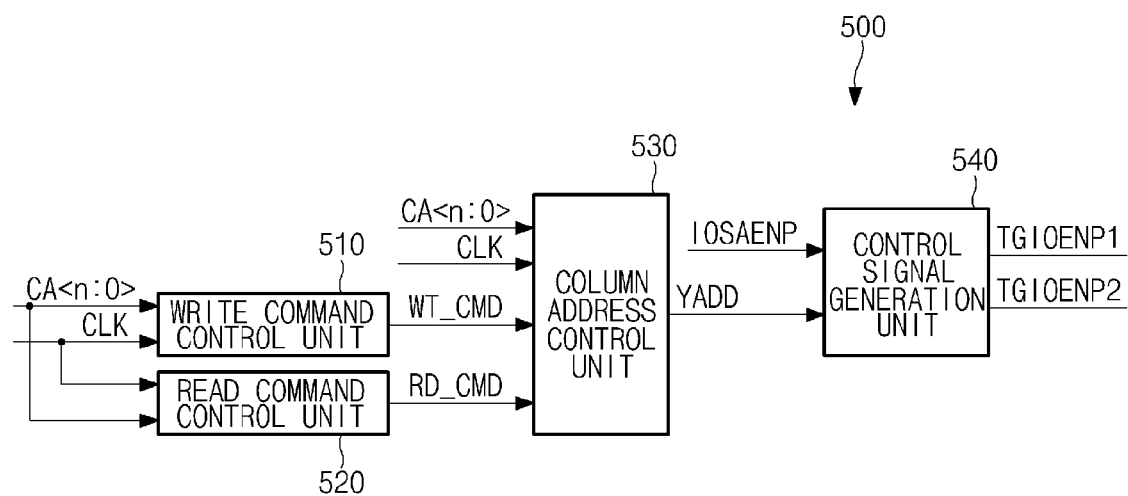
FIG. 2 is a detailed configuration diagram of the test control block of FIG. 1.

FIG. 2 is a detailed configuration diagram of the test control block 500 of FIG. 1.

The test control block 500 may include a write command control unit 510, a read command control unit 520, a column address control unit 530, and a control signal generation unit 540.

The write command control unit 510 may be configured to generate and output a write command signal WT_CMD according to the column addresses CA<n:0> and the clock CLK. The read command control unit 520 may be configured to generate and output a read command signal RD_CMD according to the column addresses CA<n:0> and the clock CLK.

The column address control unit 530 may be configured to control and output the column address YADD according to the column addresses CA<n:0>, the clock CLK, the write command signal WT_CMD and the read command signal RD_CMD. The control signal generation unit 540 may be configured to control and generate the first and second control signals TGIOENP1 and TGIOENP2 according to the sensing enable signal IOSAENP and the column address YADD.

Figure 3:
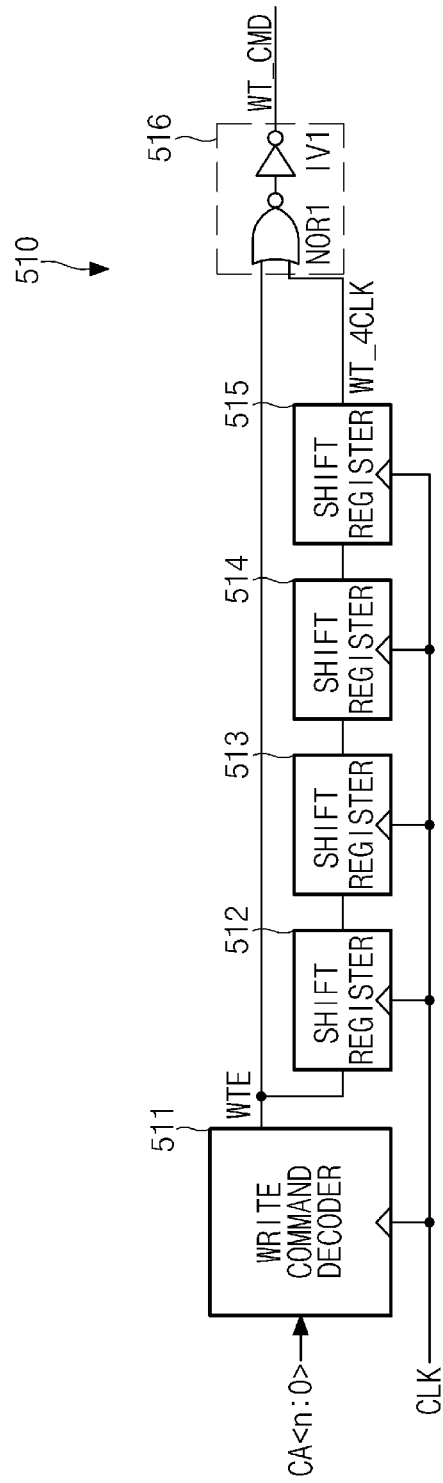
FIG. 3 is a detailed configuration diagram of the write command control unit of FIG. 2.

FIG. 3 is a detailed configuration diagram of the write command control unit 510 of FIG. 2.

The write command control unit 510 may include a write command decoder 511, a plurality of shift registers 512 to 515, and a logic combining section 516.

The write command decoder 511 may be configured to decode the column addresses CA<n:0> in synchronization with the clock CLK and output a write signal WTE. The plurality of shift registers 512 to 515 may be configured to sequentially shift the write signal WTE in synchronization with the clock CLK and output a write control signal WT_4CLK. In an embodiment of the disclosure, the shift registers 512 to 515 may output the write control signal WT_4CLK which may be delayed 4 clocks more than the write signal WTE.

The logic combining section 516 may be configured to logic-combine the write signal WTE and the write control signal WT_4CLK and output the write command signal WT_CMD. The logic combining section 516 may include a NOR gate NOR1 and an inverter IV1. The NOR gate NOR1 may NOR the write signal WTE and the write control signal WT_4CLK and output a resultant signal. The inverter IV1 may inversion-drive the output of the NOR gate NOR1 and output the write command signal WT_CMD.

The logic combining section 516 may activate the write command signal WT_CMD in a case where at least one signal of the write signal WTE and the write control signal WT_4CLK is activated. The logic combining section 516 having such a configuration may output the write command signal WT_CMD to a logic high level in the case where at least one signal of the write signal WTE and the write control signal WT_4CLK is enabled to a high level.

Figure 4:
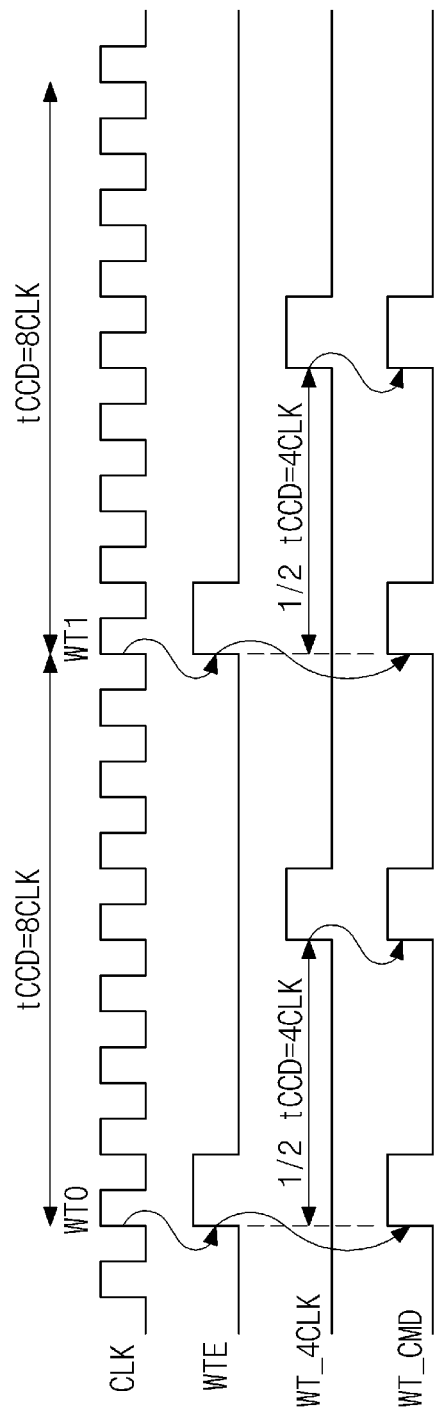
FIG. 4 is an operation timing diagram of the write command control unit of FIG. 3.

FIG. 4 is an operation timing diagram of the write command control unit 510 of FIG. 3.

In an LPDDR4 specification in accordance with an embodiment of the present disclosure, since a memory interface may operate under a 16-bit prefetch scheme, a write or read operation may be performed on the basis of a tCCD (CAS to CAS delay time) of 8 clocks.

In a prefetch operation with the burst length (BL) of "16", the tCCD may correspond to 8 clocks. In order to perform a half tCCD operation for shortening a test time, a mode with the burst length (BL) of "8" should be supported. However, in the LPDDR4 specification, the mode with the burst length (BL) of "8" may not be supported. Also, in the case where the mode with the burst length (BL) of "8" is used for only a parallel test operation, a circuit burden may increase in terms of a data path and a state path.

Thus, it is necessary to make the half tCCD operation possible, through a minimum circuit change in the existing operation mode with the burst length (BL) of "16". In an embodiment of the present disclosure, through internally toggling the most significant address 9 in the column direction by the unit of a half tCCD, column addresses of different groups may be sequentially generated twice.

First, in the write command control unit 510, when a first external write command signal WT0 is activated, the write command signal WT_CMD may be enabled by the logic combining section 516. Further, if the first external write command signal WT0 is activated, the write control signal WT_4CLK may be enabled after a delay time of 4 clocks.

The time from after the first external write command signal WT0 is activated to till the write control signal WT_4CLK is activated may be a ½ tCCD (4 CLK). As the write control signal WT_4CLK becomes a high level, the write command signal WT_CMD may be enabled once more.

In the write command control unit 510, when a second external write command signal WT1 is activated, the write command signal WT_CMD may be enabled by the logic combining section 516. Further, if the second external write command signal WT1 is activated, the write control signal WT_4CLK may be enabled after the delay time of 4 clocks.

The time from after the second external write command signal WT1 is activated to till the write control signal WT_4CLK is activated may be the ½ tCCD (4 CLK). As the write control signal WT_4CLK becomes the high level, the write command signal WT_CMD may be enabled once more.

That is to say, in the LPDDR4 specification which operates on the basis of the tCCD (CAS to CAS delay time) of 8 clocks, the write command signal WT_CMD may be enabled on the basis of 4 clocks. Accordingly, in an embodiment of the present disclosure, as a write or read operation is performed by the unit of a half tCCD in a parallel test operation, a test time may be shortened.

Figure 5:
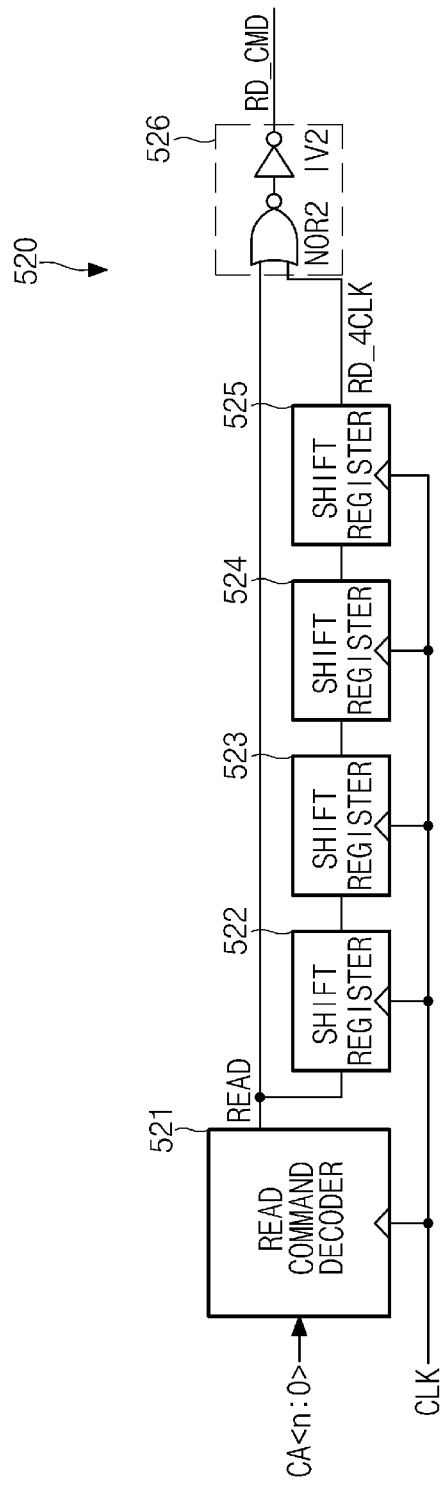
FIG. 5 is a detailed configuration diagram of the read command control unit of FIG. 2.

FIG. 5 is a detailed configuration diagram of the read command control unit 520 of FIG. 2.

The read command control unit 520 may include a read command decoder 521, a plurality of shift registers 522 to 525, and a logic combining section 526.

The read command decoder 521 may be configured to decode the column addresses CA<n:0> in synchronization with the clock CLK and output a read signal READ. The plurality of shift registers 522 to 525 may be configured to sequentially shift the read signal READ in synchronization with the clock CLK and output a read control signal RD_4CLK. In an embodiment of the present disclosure, the shift registers 522 to 525 may output the read control signal RD_4CLK which may be delayed 4 clocks more than the read signal READ.

The logic combining section 526 may be configured to logic-combine the read signal READ and the read control signal RD_4CLK and output the read command signal RD_CMD. The logic combining section 526 may include a NOR gate NOR2 and an inverter IV2. The NOR gate NOR2 may NOR the read signal READ and the read control signal RD_4CLK and output a resultant signal. The inverter IV2 may inversion-drive the output of the NOR gate NOR2 and output the read command signal RD_CMD.

The logic combining section 526 may activate the read command signal RD_CMD in the case where at least one signal of the read signal READ and the read control signal RD_4CLK is activated. The logic combining section 526 having such a configuration may output the read command signal RD_CMD to a logic high level in the case where at least one signal of the read signal READ and the read control signal RD_4CLK may be enabled to a high level.

Figure 6:
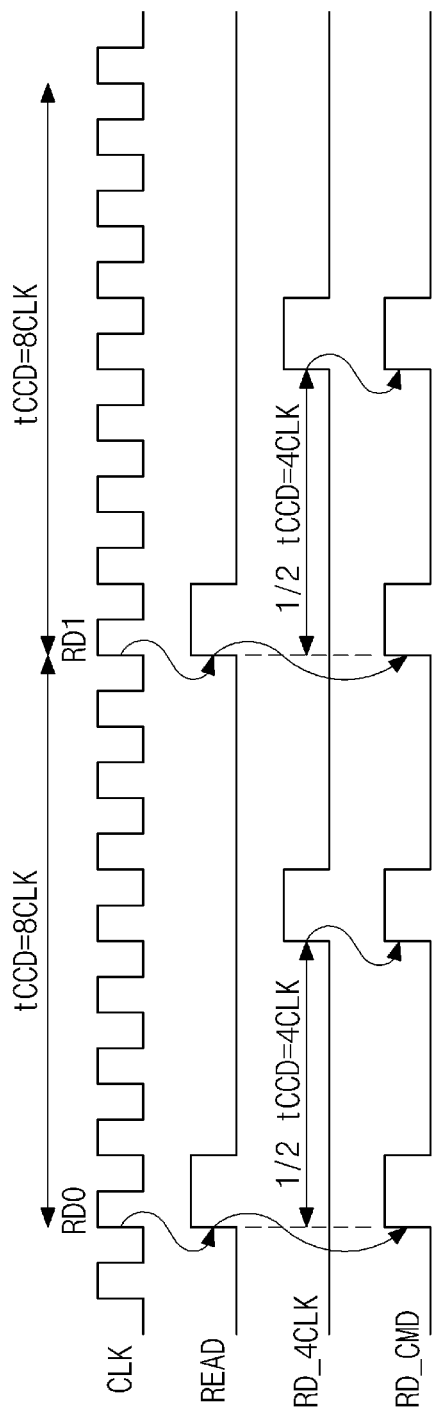
FIG. 6 is an operation timing diagram of the read command control unit of FIG. 5.

FIG. 6 is an operation timing diagram of the read command control unit 520 of FIG. 5.

In the LPDDR4 specification in accordance with an embodiment of the present disclosure, an operation may be performed on the basis of the tCCD (CAS to CAS delay time) of 8 clocks.

In the read command control unit 520, when a first external read command signal RD0 is activated, the read command signal RD_CMD may be enabled by the logic combining section 526. Further, if the first external read command signal RD0 is activated, the read control signal RD_4CLK may be enabled after a delay time of 4 clocks.

The time from after the first external read command signal RD0 is activated to till the read control signal RD_4CLK is activated may be a ½ tCCD (4 CLK). As the read control signal RD_4CLK becomes a high level, the read command signal RD_CMD may be enabled once more.

In the read command control unit 520, when a second external read command signal RD1 is activated, the read command signal RD_CMD may be enabled by the logic combining section 526. Further, if the second external read command signal RD1 is activated, the read control signal RD_4CLK may be enabled after the delay time of 4 clocks.

The time from after the second external read command signal RD1 is activated to till the read control signal RD_4CLK is activated may be the ½ tCCD (4 CLK). As the read control signal RD_4CLK becomes the high level, the read command signal RD_CMD may be enabled once more.

That is to say, in the LPDDR4 specification which operates on the basis of the tCCD (CAS to CAS delay time) of 8 clocks, the read command signal RD_CMD may be enabled on the basis of 4 clocks. Accordingly, in an embodiment of the present disclosure, as a write or read operation is performed by the unit of a half tCCD in a parallel test operation, a test time may be shortened.

Figure 7:
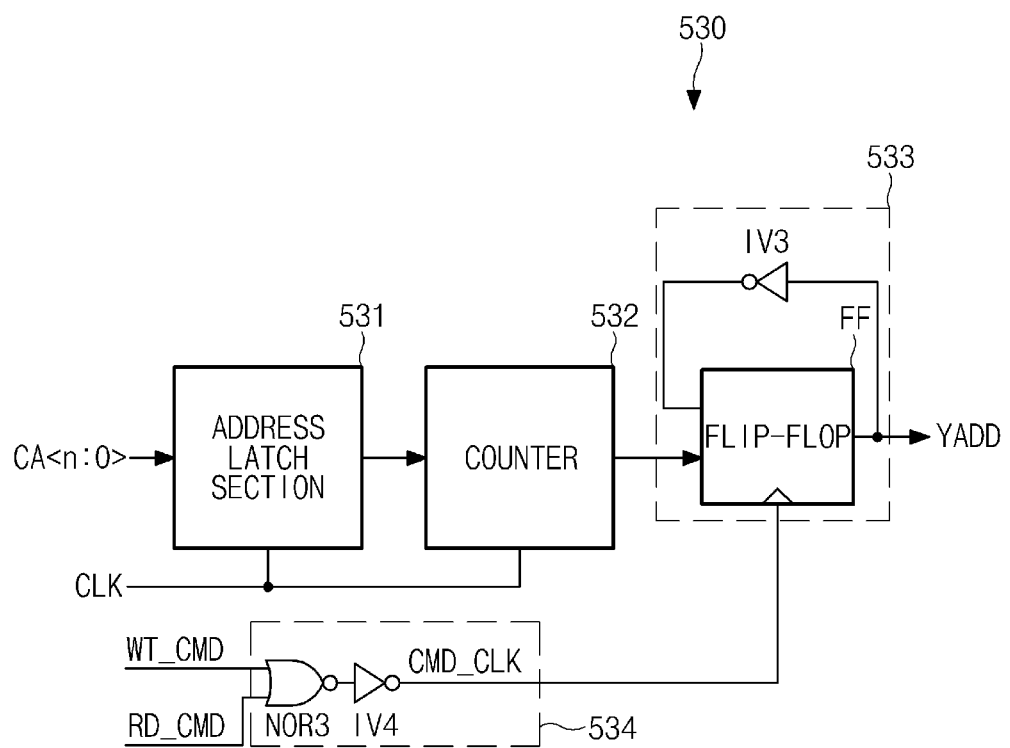
FIG. 7 is a detailed configuration diagram of the column address control unit of FIG. 2.

FIG. 7 is a detailed configuration diagram of the column address control unit 530 of FIG. 2.

The column address control unit 530 may include an address latch section 531, a counter 532, an output driving section 533, and a clock generating section 534.

The address latch section 531 may be configured to latch and output the column addresses CA<n:0> in synchronization with the clock CLK. The counter 532 may be configured to count the column address applied from the address latch section 531 in synchronization with the clock CLK. The counter 532 may configured to count an output address of the address latch section 531 in synchronization with the clock CLK.

The output driving section 533 may include a flip-flop FF and an inverter IV3. The output driving section 533 may be configured to toggle the output address of the counter 532 in synchronization with a command clock CMD_CLK applied from the clock generating section 534, and generate and output the column address YADD. The column address YADD may correspond to a most significant address YADD<9>.

The flip-flop FF may flip-flop the output of the inverter IV3 and the output address of the counter 532 in synchronization with the command clock CMD_CLK. In an embodiment of the present disclosure, the flip-flop FF may be constituted by a D flip-flop.

The clock generating section 534 may be configured to generate the command clock CMD_CLK according to the write command signal WT_CMD and the read command signal RD_CMD. The clock generating section 534 may include a NOR gate NOR3 and an inverter IV4. The NOR gate NOR3 may NOR the write command signal WT_CMD and the read command signal RD_CMD and output a resultant signal. The clock generating section 534 may be configured to combine the write command signal WT_CMD and the read command signal RD_CMD, and generate the command clock CMD_CLK. The inverter IV3 may inversion-drive the output of the NOR gate NOR3 and output the command clock CMD_ CLK. In the case where at least any one of the write command signal WT_CMD and the read command signal RD_CMD is activated, the clock generating section 534 may activate and output the command clock CMD_CLK.

Figure 8:
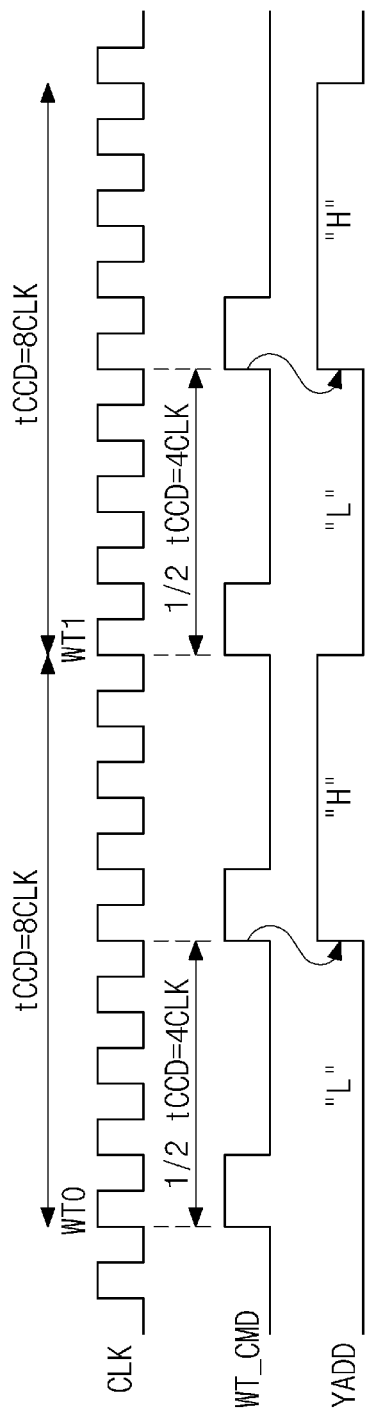
FIGS. 8 and 9 are operation timing diagrams of the column address control unit of FIG. 7.
Figure 9:
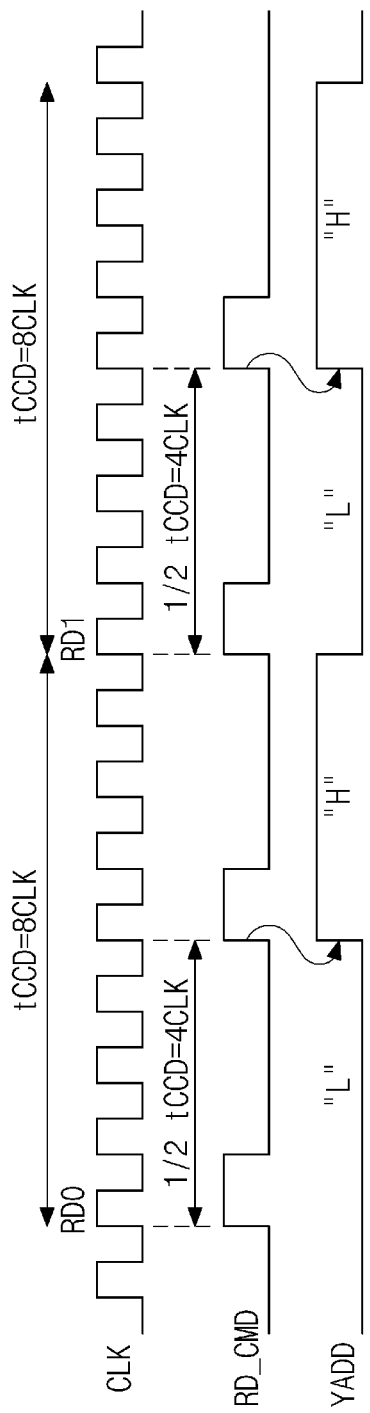

FIGS. 8 and 9 are operation timing diagrams of the column address control unit 530 of FIG. 7. First, FIG. 8 is an operation timing diagram of the column address control unit 530 in a write operation.

In the write operation, the write command signal WT_CMD may be activated according to a first external write command signal WT0. Then, the clock generating section 534 may activate and output the command clock CMD_CLK.

The address latch section 531 may latch the column addresses CA<n:0> in synchronization with the clock CLK. The counter 532 may count and output the output address of the address latch section 531 in synchronization with the clock CLK. The flip-flop FF may flip-flop the output address of the counter 532 in synchronization with the command clock CMD_CLK and then output the column address YADD.

If the first external write command signal WT0 is activated, the column address YADD may be enabled after a delay time of 4 clocks. The time from after the first external write command signal WT0 is activated to till the column address YADD is activated to a high level may be the ½ tCCD (4 CLK).

In the write operation, the write command signal WT_CMD may be activated according to a second external write command signal WT1. Then, the clock generating section 534 may activate and output the command clock CMD_CLK.

The address latch section 531 may latch the column addresses CA<n:0> in synchronization with the clock CLK. The counter 532 may count and output the output address of the address latch section 531 in synchronization with the clock CLK. The flip-flop FF may flip-flop the output address of the counter 532 in synchronization with the command clock CMD_CLK and then output the column address YADD.

If the second external write command signal WT1 is activated, the column address YADD may be enabled after the delay time of 4 clocks. The time from after the second external write command signal WT1 is activated to till the column address YADD is activated to the high level H may be the ½ tCCD (4 CLK).

In other words, in the LPDDR4 specification which operates on the basis of the tCCD (CAS to CAS delay time) of 8 clocks, the write command signal WT_CMD may be enabled on the basis of 4 clocks. Accordingly, in the write operation, the most significant column address YADD<9> may also toggle on the basis of 4 clocks.

FIG. 9 is an operation timing diagram of the column address control unit 530 in a read operation.

In the read operation, the read command signal RD_CMD may be activated according to a first external read command signal RD0. Then, the clock generating section 534 may activate and output the command clock CMD_CLK.

The address latch section 531 may latch the column addresses CA<n:0> in synchronization with the clock CLK. The counter 532 may count and output the output address of the address latch section 531 in synchronization with the clock CLK. The flip-flop FF may flip-flop the output address of the counter 532 in synchronization with the command clock CMD_CLK and then output the column address YADD.

If the first external read command signal RD0 is activated, the column address YADD may be enabled after the delay time of 4 clocks. The time from after the first external read command signal RD0 is activated to till the column address YADD is activated to the high level H may be the ½ tCCD (4 CLK). The column address YADD may also be activated to the low level L.

In the read operation, the read command signal RD_CMD may be activated according to a second external read command signal RD1. Then, the clock generating section 534 may activate and output the command clock CMD_CLK.

The address latch section 531 may latch the column addresses CA<n:0> in synchronization with the clock CLK. The counter 532 may count and output the output address of the address latch section 531 in synchronization with the clock CLK. The flip-flop FF may flip-flop the output address of the counter 532 in synchronization with the command clock CMD_CLK and then output the column address YADD.

If the second external read command signal RD1 is activated, the column address YADD may be enabled after the delay time of 4 clocks. The time from after the second external read command signal RD1 is activated to till the column address YADD is activated to the high level may be the ½ tCCD (4 CLK). Namely, in the LPDDR4 specification which operates on the basis of the tCCD (CAS to CAS delay time) of 8 clocks, the read command signal RD_CMD may be enabled on the basis of 4 clocks, and in the read operation, the column address YADD may also be enabled on the basis of 4 clocks.

Figure 10:
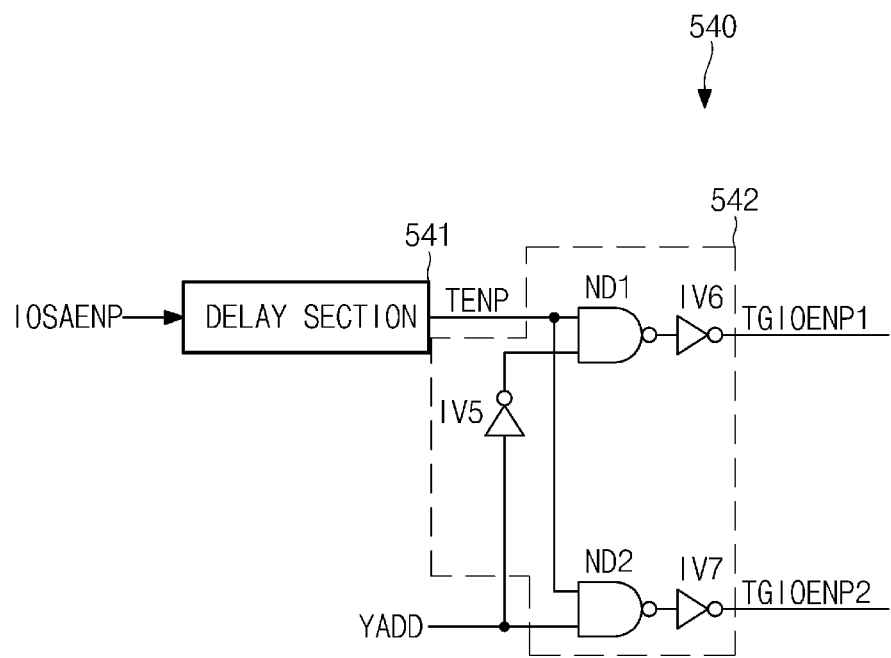
FIG. 10 is a detailed configuration diagram of the control signal generation unit of FIG. 2.

FIG. 10 is a detailed configuration diagram of the control signal generation unit 540 of FIG. 2.

The control signal generation unit 540 may include a delay section 541, and a control signal output section 542.

The delay section 541 may be configured to delay the sensing enable signal IOSAENP by a predetermined time and generate and output an enable signal TENP.

The control signal output section 542 may include NAND gates ND1 and ND2 and a plurality of inverters IV5 to IV7. The NAND gate ND1 may NAND the enable signal TENP and the column address YADD inverted by the inverter IV5. The NAND gate ND2 may NAND the enable signal TENP and the column address YADD. The inverter IV6 may inversion-drive the output of the NAND gate ND1 and output the First control signal TGIOENP1. The inverter IV7 may inversion-drive the output of the NAND gate ND2 and output the Second control signal TGIOENP2. Moreover, the control signal output section 542 may be configured to logic-combine the enable signal TENP and the column address YADD and output the first control signal TGIOENP1 and the second control signal TGIOENP2. In addition, the control output section may be configured to alternately activate the First control signal TGIOENP1 and the Second control signal TGIOENP2 according to a level of the column address YADD at a time when the enable signal TENP is activated.

Figure 11:
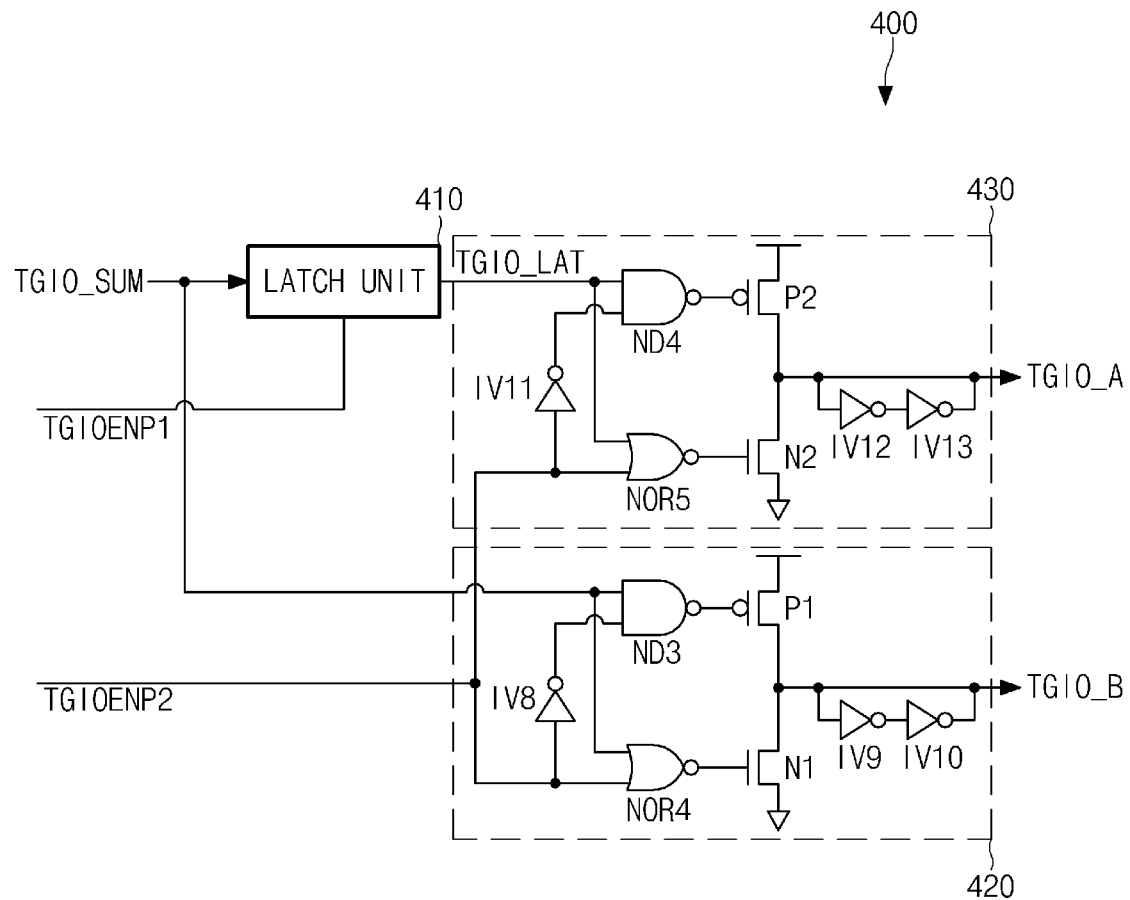
FIG. 11 is a detailed configuration diagram of the control block of FIG. 1.

FIG. 11 is a detailed configuration diagram of the control block 400 of FIG. 1.

The control block 400 may include the latch unit 410, and the driving units 420 and 430.

The latch unit 410 may latch the compression data TGIO_SUM according to the control signal TGIOENP1 and output the latched data TGIO_LAT.

The first driving unit 420 may drive the compression data TGIO_SUM according to the second control signal TGIOENP2 and output resultant data to the first data line TGIO_B. The first driving unit 420 may include a NAND gate ND3, a NOR gate NOR4, a plurality of inverters IV8 to IV10, a PMOS transistor P1, and an NMOS transistor N1.

The NAND gate ND3 may NAND the compression data TGIO_SUM and the control signal TGIOENP2 inverted by the inverter IV8. The NOR gate NOR4 may NOR the compression data TGIO_SUM and the control signal TGIOENP2. The PMOS transistor P1 and the NMOS transistor N1 may be connected in series between a power supply voltage terminal and a ground voltage terminal. The PMOS transistor P1 may be applied with the output of the NAND gate ND3 through the gate terminal thereof. The NMOS transistor N1 may be applied with the output of the NOR gate NOR4 through the gate terminal thereof. The inverters IV9 and IV10 may delay the signal applied through the common drain terminal of the PMOS transistor P1 and the NMOS transistor N1, and output a resultant signal to the first data line TGIO_B.

The driving unit 430 may drive the latched data TGIO_LAT according to the control signal TGIOENP2 and output resultant data to the second data line TGIO_A. The driving unit 430 may include a NAND gate ND4, a NOR gate NOR5, a plurality of inverters IV11 to IV13, a PMOS transistor P2, and an NMOS transistor N2.

The NAND gate ND4 may NAND the latched data TGIO_LAT and the control signal TGIOENP2 inverted by the inverter IV11. The NOR gate NOR5 may NOR the latched data TGIO_LAT and the control signal TGIOENP2. The PMOS transistor P2 and the NMOS transistor N2 may be connected in series between the power supply voltage terminal and the ground voltage terminal. The PMOS transistor P2 may be applied with the output of the NAND gate ND4 through the gate terminal thereof. The NMOS transistor N2 may be applied with the output of the NOR gate NOR5 through the gate terminal thereof. The inverters IV12 and IV13 may delay the signal applied through the common drain terminal of the PMOS transistor P2 and the NMOS transistor N2, and output a resultant signal to the second data line TGIO_A.

Figure 12:
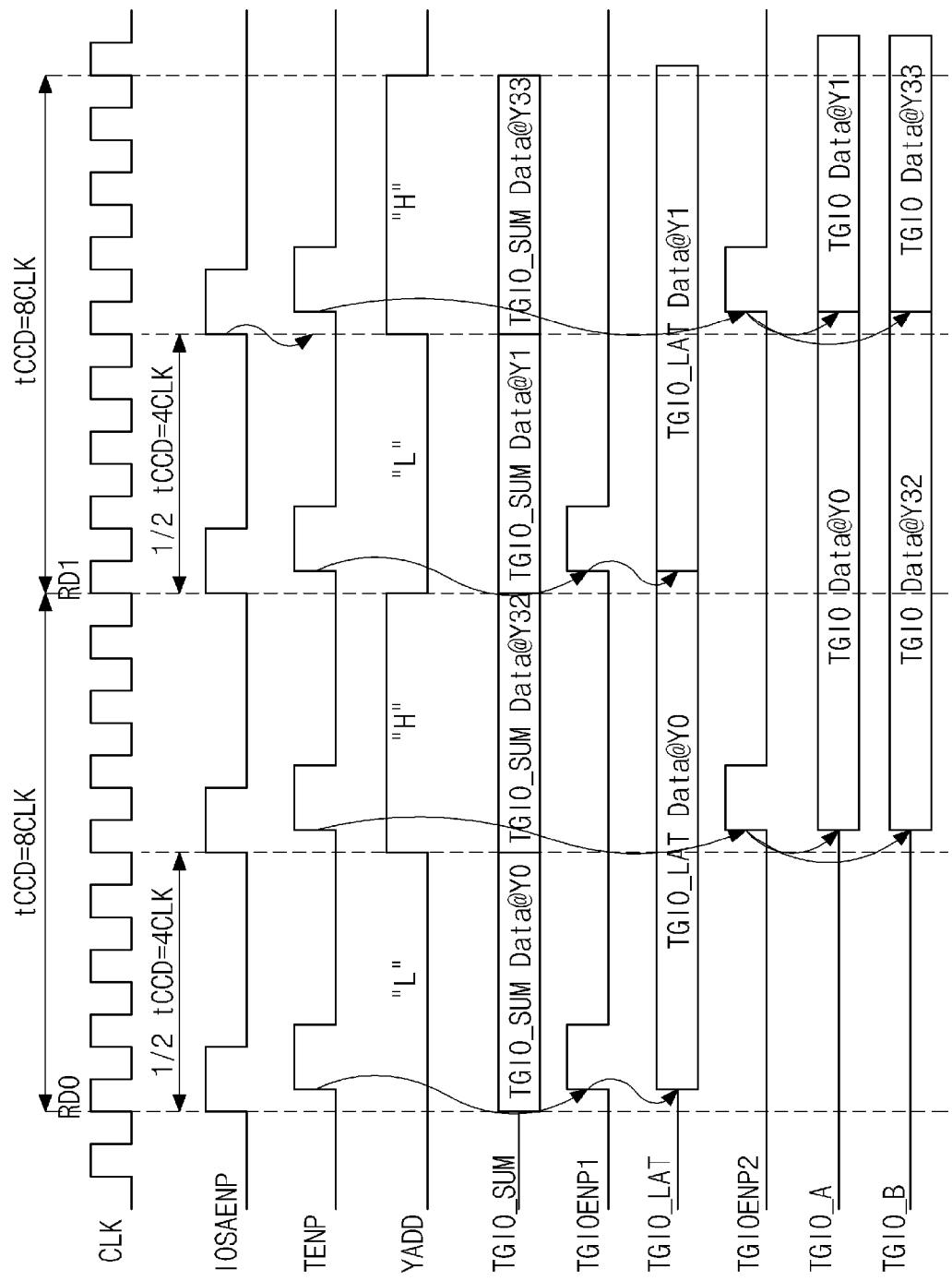
FIG. 12 is an operation timing diagram of the control block of FIG. 11.

FIG. 12 is an operation timing diagram of the control block 400 of FIG. 11.

First, in the read operation, the sensing enable signal IOSAENP may be enabled according to a first external read command signal RD0. The delay section 541 may delay the sensing enable signal IOSAENP by the predetermined time and activate the enable signal TENP.

In the case where the enable signal TENP is a high level H and the column address YADD is a low level L, the control signal TGIOENP1 outputted from the control signal output section 542 may become a high level. The latch unit 410 may latch the compression data TGIO_SUM according to the control signal TGIOENP1, and activate and output the latched data TGIO_LAT. Also illustrated are TGIO_SUM Data@Y0 thru TGIO_SUM Data@Y33, TGIO_LAT Data@Y0 to TGIO_LAT Data@Y1, and TGIO Data@Y0 to TGIO Data@Y33.

When the delay time of 4 clocks has passed after the first external read command signal RD0 is activated, the sensing enable signal IOSAENP may be activated again. Then, the delay section 541 may delay the sensing enable signal IOSAENP by the predetermined time and activate the enable signal TENP.

In the case where the enable signal TENP is the high level and the column address YADD transitions to the high level, the control signal TGIOENP2 outputted from the control signal output section 542 may become a high level. That is to say, the control block 400 alternately may activate the control signal TGIOENP1 and the control signal TGIOENP2 according to the state of the column address YADD at the time when the enable signal TENP is activated.

The driving unit 420 may drive the compression data TGIO_SUM according to the control signal TGIOENP2 and output resultant data to the first data line TGIO_B. In the case where the control signal TGIOENP2 is enabled to the high level, the driving unit 430 may logic-combine the latched data TGIO_LAT and the control signal TGIOENP2 and output resultant data to the second data line TGIO_A.

Figure 13:
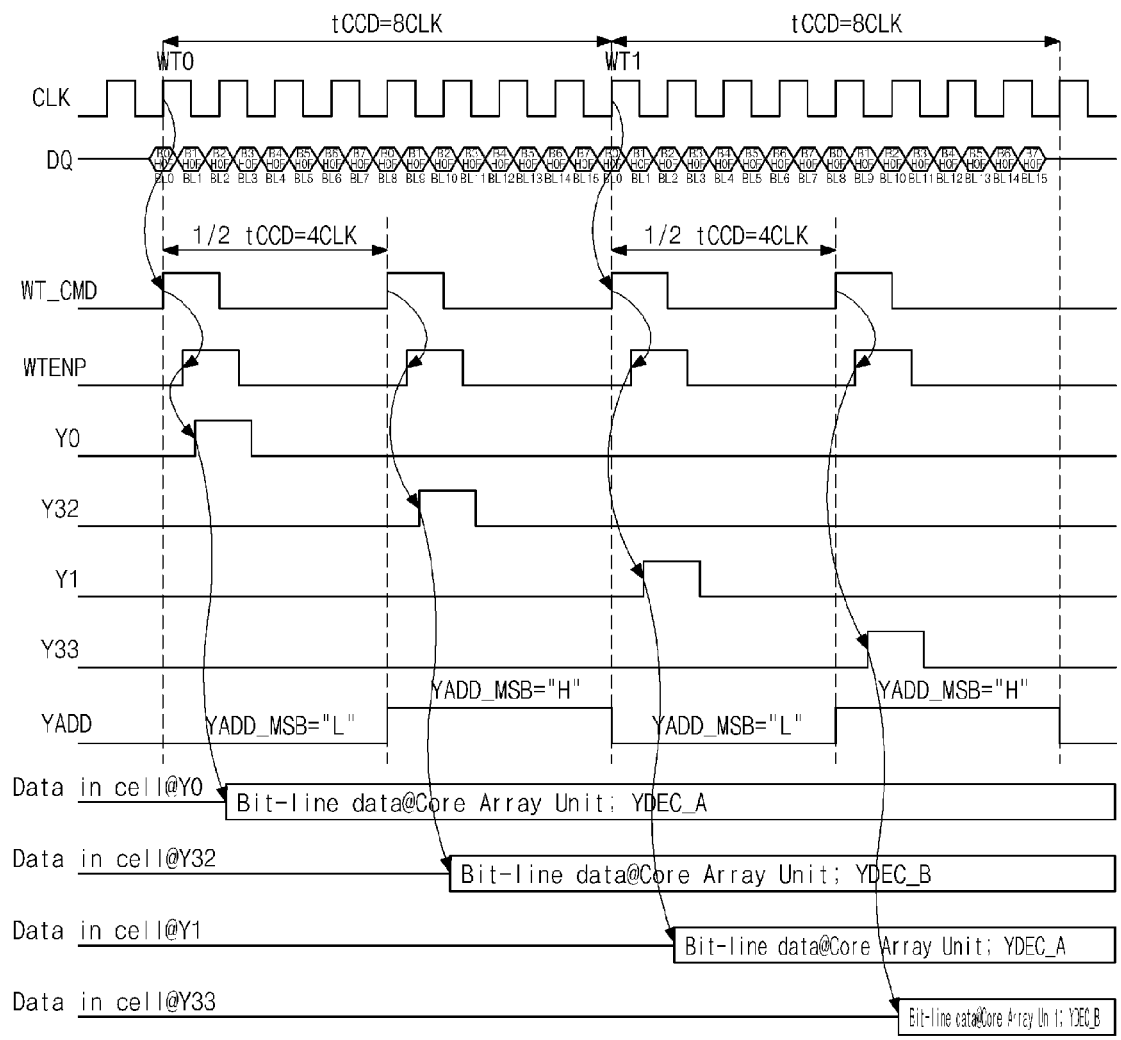
FIG. 13 is a write operation timing diagram of the semiconductor device in accordance with an embodiment of the present disclosure.

FIG. 13 is a write operation timing diagram of the semiconductor device in accordance with an embodiment of the present disclosure.

In the write operation, write data DQ may be inputted through an input pad. In the write operation, an external write command signal WT may be applied by the unit of 8 clocks. If a first external write command signal WT0 is applied, the write command signal WT_CMD may be activated with the cycle of 4 clocks. In other words, the pulse of the internally generated write command signal WT_CMD may be generated by the unit of the half tCCD.

Then, the write enable signal WTENP may be activated according to the write command signal WT_CMD. Thereupon, the write data DQ may be driven through the write driving units 120_1 to 120_4, and column data Y0 to Y63 may be selectively activated. The write data DQ may include data of blocks B0 to B7, core cell array blocks H0F, and bit lines BL0 to BL15.

In other words, the plurality of respective column decoders 110_1 to 110_4 may decode the column address YADD, selectively activate the column data Y0 to Y63, and select corresponding cells. For example, the column data Y0 to Y63 may be selectively activated in synchronization with clocks by which the write enable signal WTENP may be activated.

The plurality of respective column decoders 110_1 to 110_4 may be divided into column decoders A and column decoders B. For instance, the column decoders A may selectively activate the column data Y0 to Y31 of a first group, and the column decoders B may selectively activate the column data Y32 to Y63 of a second group.

Namely, in the LPDDR4 specification in accordance with an embodiment of the present disclosure, a semiconductor device may have a structure which has 2 channels for each chip and 8 banks for each channel. Then, the semiconductor device in accordance with an embodiment of the present disclosure may operate on the basis of the burst length (BL) of "16" in a ×4 parallel test. Accordingly, an input/output compressing operation may be performed in such a way as to prefetch 2 groups in one bank.

If the most significant bit (MSB) of the column address YADD is a logic low level, one of the column data Y0 to Y31 of the first group may be selected. If the most significant bit (MSB) of the column address YADD is a logic high level, one of the column data Y32 to Y63 of the second group may be selected.

That is to say, column addresses of different groups are sequentially activated according to the logic level of the most significant column address YADD<9>. The column data may be activated in the order of Y0, Y32, Y1, Y33, . . . by the unit of 4 clocks in synchronization with the enable time of the write enable signal WTENP.

For instance, if the first external write command signal WT0 is applied, the column data Y0 of the column decoder A and the column data Y32 of the column decoder B may be sequentially activated. Then, if a second external write command signal WT1 is applied, the column data Y1 of the column decoder A and the column data Y33 of the column decoder B may be sequentially activated, by which data are written in the core array blocks 100_1 to 100_4. Also illustrated are data in cell@Y0, data in cell@Y32, data in cell@Y1, and data in cell@Y33 and Bit-line data@Core Array Unit; YDEC_A and Bit-Line data@Core Array Unit; YDEC_B.

According to this fact, in an embodiment of the present disclosure, since only one half of the addresses needed in an actual write operation is necessary when viewed on a most significant address, a test time may be shortened in a parallel test.

Figure 14:
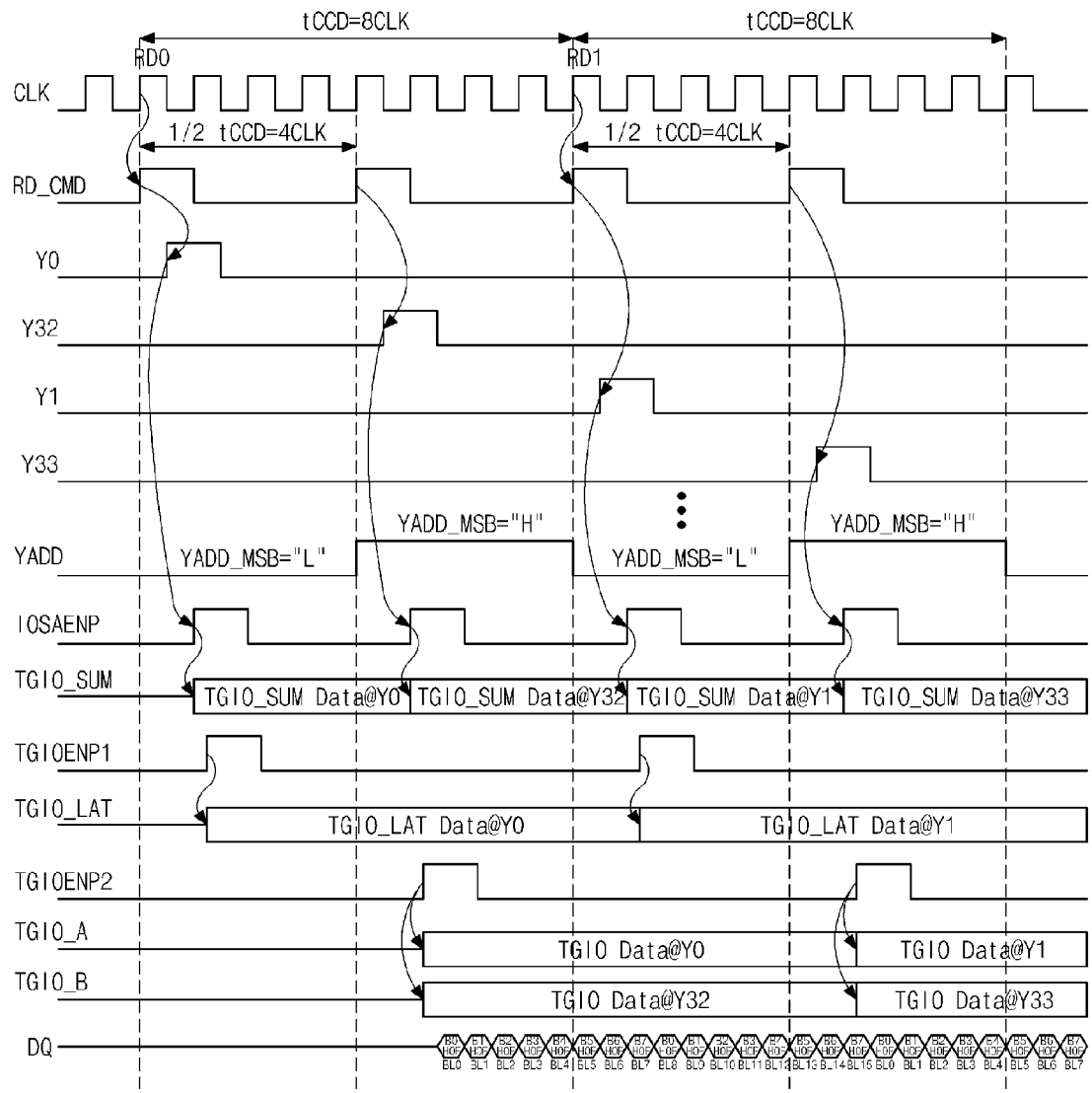
FIG. 14 is a read operation timing diagram of the semiconductor device in accordance with an embodiment of the present disclosure.

FIG. 14 is a read operation timing diagram of the semiconductor device in accordance with an embodiment of the present disclosure.

In the read operation, if a first external read command signal RD0 is applied, the read command signal RD_CMD may be activated with the cycle of 4 clocks. Then, column data are activated in the order of Y0, Y32, Y1, Y33, . . . by the unit of 4 clocks according to the read command signal RD_CMD. That is to say, column addresses of different groups may be sequentially activated according to the logic level of the most significant column address YADD<9>.

For instance, if the first external read command signal RD0 is applied, the column data Y0 of the column decoder A and the column data Y32 of the column decoder B may be sequentially activated. Then, if a second external read command signal RD1 is applied, the column data Y1 of the column decoder A and the column data Y33 of the column decoder B may be sequentially activated, by which data of the core array blocks 100_1 to 100_4 are read.

Thereafter, according to the activation of the column data Y0, Y32, Y1 and Y33, the data of the core array blocks 100_1 to 100_4 may be transferred to the plurality of input/output sense amplifiers 130_1 to 130_4. Successively, when the sensing enable signal IOSAENP is activated, the plurality of input/output sense amplifiers 130_1 to 130_4 may sense and amplify the data and output resultant data to the compression block 200. The compression block 200 may compress the data applied from the plurality of input/output sense amplifiers 130_1 to 130_4, and output the compression data T_SUM_H07 and T_SUM_H8F to the combination block 300.

Next, the combination block 300 may combine the compression data T_SUM_H07 and T_SUM_H8F and output the one compression data TGIO_SUM to the control block 400. The combination block 300 may sequentially output the column data Y0, Y32, Y1 and Y33 as the compression data TGIO_SUM in synchronization with the activation time of the sensing enable signal IOSAENP.

The control block 400 may latch the column data Y0, Y1, Y2, . . . and Y31 as the latched data TGIO_LAT according to the control signal TGIOENP1 which is already enabled at the times when the external read command signals RD0 and RD1 are applied. That is to say, the column data Y0, Y1, Y2, . . . and Y31, corresponding to the period in which the most significant column address YADD<9> is the low level, may be latched.

The control block 400 may drive and output the column data Y32, Y33, Y34, . . . and Y63 when the control signal TGIOENP2 becomes the activated state after the predetermined time. At the same time with this, the control block 400 may simultaneously output the latched column data Y0, Y1, Y2, . . . and Y31 as well.

In other words, the control block 400 may output data to the first data line TGIO_B and the second data line TGIO_A according to the operations of the driving units 420 and 430 when the control signal TGIOENP2 becomes the activated state. The column data Y0, Y1, Y2, . . . and Y31 of the first group which are generated when the most significant column address YADD<9> is the logic low level may be outputted to the second data line TGIO_A. The column data Y32, Y33, Y34, . . . and Y63 of the second group which are generated when the most significant column address YADD<9> is the logic high level may be outputted to the first data line TGIO_B. Accordingly, the read data DQ may be outputted through the input pad.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
    a compression block configured to compare and compress data of a plurality of core array blocks, by a unit of a group;
    a combination block configured to combine outputs of the compression block and output compression data; and
    a control block configured to latch the compression data and output latched data, and drive the latched data and the compression data and output resultant data to a first data line and a second data line.

2. The semiconductor device according to claim 1, wherein a first control signal and a second control signal are controlled in their logic states by a level of a most significant column address.

3. The semiconductor device according to claim 2, wherein the most significant column address toggles by the unit of a half tCCD (CAS to CAS delay time).

4. The semiconductor device according to claim 1, wherein column data of different groups are sequentially activated by the level of the most significant column address, and are transferred as the compression data.

5. The semiconductor device according to claim 1, wherein the control block comprises:
    a latch unit configured to latch the compression data according to a first control signal and output the latched data;
    a first driving unit configured to drive the compression data according to a second control signal and output resultant data to the first data line; and
    a second driving unit configured to drive the latched data according to the second control signal and output resultant data to the second data line.

6. The semiconductor device according to claim 5, wherein, in the driving units, enable times of the first control signal and the second control signal are different from each other, and the compression data and the latched data are simultaneously outputted when the second control signal is enabled.

7. The semiconductor device according to claim 1, further comprising:
    a test control block configured to generate a first control signal and a second control signal according to a column address, a clock and a sensing enable signal.

8. The semiconductor device according to claim 7, wherein the test control block comprises:
    a write command control unit configured to generate a write command signal according to the column addresses and the clock;
    a read command control unit configured to generate a read command signal according to the column addresses and the clock;
    a column address control unit configured to control a column address according to the column addresses, the clock, the write command signal and the read command signal; and
    a control signal generation unit configured to control the first control signal and the second control signal according to the sensing enable signal and the column address.

9. The semiconductor device according to claim 8, wherein the write command control unit comprises:
    a write command decoder configured to decode the column addresses in synchronization with the clock, and output a write signal;
    a plurality of shift registers configured to sequentially shift the write signal in synchronization with the clock, and output a write control signal; and
    a logic combing section configured to logic-combine the write signal and the write control signal, and output the write command signal.

10. The semiconductor device according to claim 8, wherein the read command control unit comprises:
    a read command decoder configured to decode the column addresses in synchronization with the clock, and output a read signal;
    a plurality of shift registers configured to sequentially shift the read signal in synchronization with the clock, and output a read control signal; and a logic combing section configured to logic-combine the read signal and the read control signal, and output the read command signal.

11. The semiconductor device according to claim 8, wherein the column address control unit comprises:
   an address latch section configured to latch the column addresses in synchronization with the clock;
   a counter configured to count an output address of the address latch section in synchronization with the clock;
   an output driving section configured to toggle an output of the counter in synchronization with a command clock, and generate the column address; and
   a clock generating section configured to combine the write command signal and the read command signal, and generate the command clock.

12. The semiconductor device according to claim 8, wherein the control signal generation unit comprises:
   a delay section configured to delay the sensing enable signal by a predetermined time, and generate an enable signal; and
   a control signal output section configured to logic-combine the enable signal and the column address, and output the first control signal and the second control signal.

13. The semiconductor device according to claim 12, wherein the control signal output section alternately activates the first control signal and the second control signal according to a level of the column address at a time when the enable signal is activated.

14. The semiconductor device according to claim 1, wherein the compression block compares and compresses the data of the plurality of core array blocks by dividing them into 2 prefetch groups.

15. The semiconductor device according to claim 1, further comprising:
   a plurality of column decoders configured to decode the column address and select corresponding cells of the plurality of core array blocks;
   a plurality of input/output sense amplifiers configured to sense and amplify read data applied from the plurality of core array blocks according to the sensing enable signal;
   a plurality of write driving units configured to drive write data applied from a global input/output line according to a write enable signal, and output resultant data to the plurality of core array blocks;
   a plurality of driving units configured to drive data applied from the plurality of input/output sense amplifiers, and output resultant data to the compression block.

16. A semiconductor device comprising:
   a compression block configured to perform a compression test for data in a probe test and output a compression data;
   a combination block configured to combine and output the compression data; and
   a control block configured to latch the compression data and output latched data, and drive the compression data and output resultant data to a first data line and a second data line.

17. The semiconductor device of claim 16, wherein the control block comprises:
   a latch unit configured to latch the compression data and output the latched data;
   a first driving unit configured to drive the compression data and output the resultant data to the first data line; and
   a second driving unit configured to drive the latched data and output the resultant data to the second data line.

18. The semiconductor device of claim 17, further comprising:
   a test control block configured to generate a first control signal and a second control signal and output the first control signal and the second control signal to the control block.

19. The semiconductor device of claim 18, wherein the test control block is configured to output a write command signal and a read command signal and generate the first control signal and the second control signal according to a sensing enable signal and a column address.

20. The semiconductor device of claim 19, further comprising:
   a write command control unit configured to decode the column address according to a clock, output a write signal, and shift the write signal according to the clock and output a write control signal.

* * * * *